United States Patent [19]
Kadota et al.

[11] Patent Number: 5,802,685
[45] Date of Patent: Sep. 8, 1998

[54] METHOD FOR MANUFACTURING SURFACE WAVE DEVICES OF THE END-FACE REFLECTION TYPE

[75] Inventors: Michio Kadota, Kyoto; Naoki Mizoguchi, Takefu, both of Japan

[73] Assignee: Murata Manufacturing Co., Ltd., Kyoto-fu, Japan

[21] Appl. No.: 674,248

[22] Filed: Jul. 1, 1996

[30] Foreign Application Priority Data

Jun. 30, 1995 [JP] Japan ................................ 7-166295

[51] Int. Cl.$^6$ ................................................ H01L 41/22
[52] U.S. Cl. ................................... 29/25.35; 310/313 B
[58] Field of Search ..................... 29/25.35; 310/313 B, 310/313 C, 313 D, 368

[56] References Cited

PUBLICATIONS

Patent Abstracts of Japan, vol. 17, No. 599 (E–1455), Nov. 2, 1993, and JP–A–05 183376 (Murata Mfg. Co. Ltd.), Jul. 23, 1993.

Patent Abstracts of Japan, vol. 9, No. 169 (E–328), Jul. 13, 1985 and JP–A–60 041809 (Fujitsu KK), Mar. 1985.

Michio Kadota et al., "Ceramic Resonators Using BGS Waves", Japanese Journal of Applied Physics, Supplements, vol. 31, No. Suppl. 31–1, Jan. 1, 1992, pp. 219–221.

*Primary Examiner*—Carl E. Hall
*Attorney, Agent, or Firm*—Ostrolenk, Faber, Gerb & Soffen, LLP

[57] ABSTRACT

A method of manufacturing a surface wave device of an end-face reflection type comprising forming an IDT 12 on a piezoelectric plate 11, and cutting the piezoelectric plate 11 in a direction which is parallel to the outermost electrode fingers of the IDT within a target area which extends from the out edges of the outermost electrodes to a position $\lambda/8$ outwardly therefrom, $\lambda$ being the wavelength of the surface wave generated by the IDT, so as to form opposite end faces of the surface wave device.

24 Claims, 9 Drawing Sheets

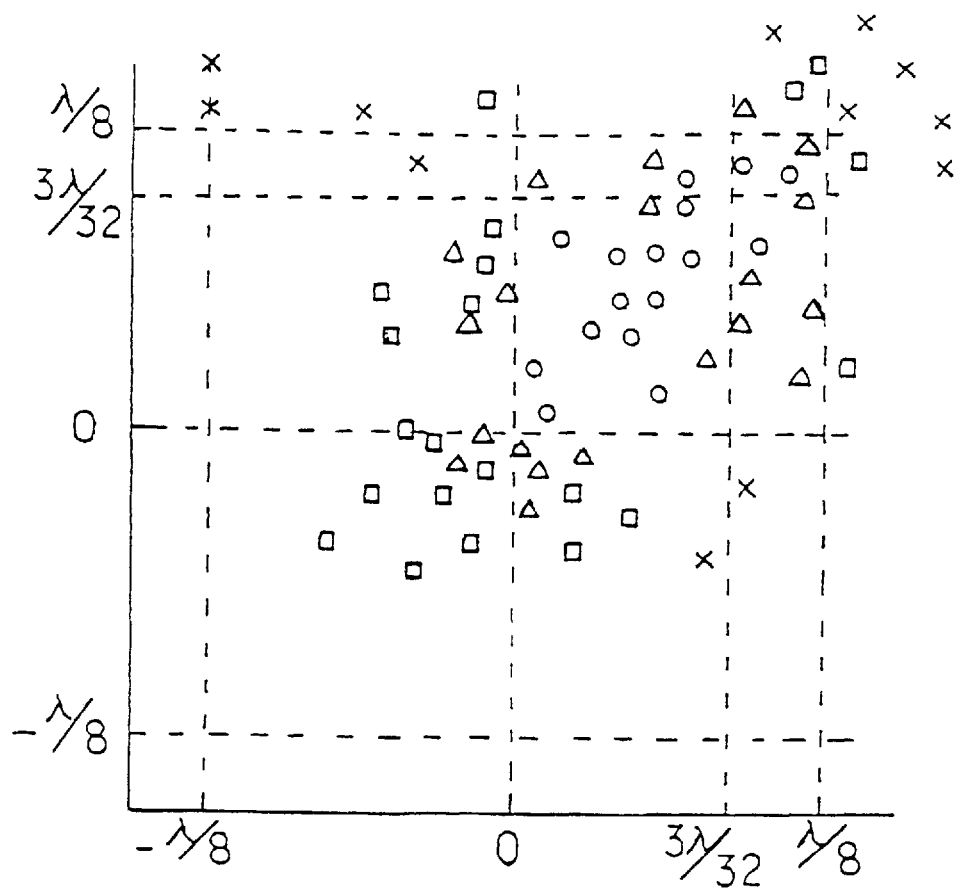

METHOD FOR MANUFACTURING SURFACE WAVE DEVICES OF THE END-FACE REFLECTION TYPE

BACKGROUND OF THE INVENTION

1. Field of the Invention

This invention relates to a method for manufacturing surface wave devices of an end-face reflection type which utilize an SH-type surface wave, and more particularly to a manufacturing method in which improves the process by which opposite end reflecting faces of the surface wave device are formed.

2. Prior Art

Surface acoustic wave devices of an end-face reflection type which reflect SH-type surface waves between opposite end faces of a piezoelectric substrate are well known. One example of such a known surface acoustic wave device will be explained by referring to FIG. 1.

Surface wave resonator 1 comprises a rectangular piezoelectric substrate 2 formed from a single piezoelectric crystal. An interdigital transducer, hereinafter referred to as "the IDT", is formed on a top surface 2a of the substrate 2. The IDT comprises a set of comb-shaped electrodes 3, 4 which include a plurality of electrode fingers 3a–3c and 4a–4c which are interlaced with one other.

The distance between the electrode fingers 3a–4c is preferably $\lambda/4$, wherein $\lambda$ is the wavelength of a surface wave to be oscillated. The width of the electrode fingers 3c, 4a (which are located on opposite ends of the substrate 2 relative to the direction of propagation of the surface wave indicated by the arrow X) is $\lambda/8$, while the width of the remaining electrode fingers 3a, 3b, 4b, 4c is $\lambda/4$. The outer edges of electrode fingers 3c, 4a extend along the end faces 2c, 2b, respectively, of the piezoelectric substrate 2.

An alternating current is applied to the comb-shaped electrodes 3, 4, to generate a BGS wave which propagates in the direction of arrow X and is reflected between the opposite end faces 2b, 2c of the substrate 2. The surface wave resonator 1 has resonant point fr and an anti-resonant point fa, as shown by the characteristic of impedance vs. frequency in FIG. 2.

Since the surface wave resonator 1 causes the BGS wave to oscillate between the opposite end faces of the substrate 2, it is necessary to accurately form the end faces 2b, 2c. If the position of the end faces 2b, 2c is not accurate, the desired resonant characteristics are not obtained. Also, if the end faces 2b, 2c are not sufficiently flat, unwanted spurious signals will occur.

In the conventional process for manufacturing a surface wave resonator 1 of the end-face reflection type, comb-shaped electrodes 3, 4 are formed on a piezoelectric substrate 5 (FIG. 3) whose width is greater than the width of the substrate 2 of the final product. Thereafter, the piezoelectric substrate 5 is cut along the line A using a dicer to form an end face 2b (FIG. 1) which is flush with the edge of the electrode finger 4a. In a similar manner, the opposite end face 2c is exposed by cutting the piezoelectric plate 5 along the outer edge of the electrode finger 3c to provide the piezoelectric substrate 2 having the interdigital electrodes 3, 4 formed thereon.

That is, the conventional method for forming end faces 2b, 2c requires the preparation of a piezoelectric plate 5 which is larger than the final piezoelectric substrate 2, and then accurately cutting the piezoelectric plate 5 along outer edges of the electrode fingers 3c, 4a.

In the conventional manufacturing method, it is difficult to cut the a piezoelectric plate with accuracy exactly along the outer edges of the electrode fingers 3c, 4a with the result that it is difficult to obtain a desired resonant characteristic in the surface wave resonator 1 of end-face reflection type.

Even if the accuracy at which the piezoelectric plate 5 is cut is raised to as high a degree as possible, it is very difficult to accurately cut the piezoelectric plate 5 exactly along outer end edges of the electrode digits 3c, 4a. If cutting is done inside the outer edge of the electrode fingers 3c, 4a, the electrode fingers 3c, 4a are cut along with the piezoelectric plate 5. As a result, chipping is likely to occur in the end faces 2b, 2c as shown by the arrow B in FIG. 4. If such chipping occurs, the end face significantly degrades in accuracy and it is not possible to achieve the desired resonant characteristics.

BRIEF DESCRIPTION OF THE INVENTION

It is therefore an object of the present invention to provide a manufacturing method for a surface wave device of an end-face reflection type, which is less likely to result in chipping during the cutting of a piezoelectric plate and which is capable of accurately providing a desired resonant characteristic.

A method for manufacturing a surface wave device of an end-face reflection type having interdigital transducers formed on a piezoelectric substrate, comprises the steps of:

forming an interdigital transducer on a piezoelectric plate, said interdigital transducer generating a surface wave which propagates along a propagation direction upon the application of an energizing signal thereto, said interdigital transducer having a plurality of interdigited electrode fingers extending generally perpendicular to said propagation direction and including an outermost pair of electrode fingers relative to said propagation direction, said outermost pair of electrode fingers having a width of $\lambda/8$, $\lambda$ being the wavelength of said surface wave, and the remaining said electrode fingers having a width of $\lambda/4$, said interdigital transducer having a width which is less than the width of said piezoelectric plate; and defining a pair of target areas in which to cut said piezoelectric plate, each of said target areas extending from an outer edge of a respective one of said outermost pair of electrode fingers to a position $\lambda/8$ outwardly therefrom; and cutting said piezoelectric plate within said target areas.

The resulting product is preferably of the type which reflects an SH-type surface wave between opposite end faces of the surface wave device. In this specification, an SH-type surface wave refers to surface waves which have displacement perpendicular to the direction of propagation of the surface wave and contain a component which is parallel to the surface of the substrate. Examples of SH-type waves are a leaky wave, a lobe wave and a BGS wave.

In the present invention, an IDT is preferably first formed on a piezoelectric plate by a set of comb-shaped electrodes each of which has one or more electrode fingers. The electrode fingers arranged so as to interleave into each other. Outermost electrode fingers on the opposite sides of the piezoelectric plate relative to a direction of propagation of a surface wave have a width of $\lambda/8$, and the remaining electrode fingers have a width of $\lambda/4$.

In the invention, it is possible to employ a piezoelectric plate comprising an $LiNbO_3$ piezoelectric plate of 41-degree rotated Y-plate X-propagation, an $LiNbO_3$ piezoelectric plate of 64-degree rotated Y-plate X-propagation, or an LiTaO$_3$ piezoelectric plate of 36-degree rotated Y-plate X-propagation, or a piezoelectric plate formed of piezoelectric ceramics.

A piezoelectric plate, which has a larger size than that of the IDT as measured along the direction of surface-wave propagation, is used so as to making it possible to cut the piezoelectric plate to form the two end faces of the surface wave device during a cutting process carried out later.

The IDT is preferably formed of a conductive material such as a metal, e.g., of aluminum, gold, or the like. Although there is no limitation on the manner of forming an IDT, it may be formed, for example, by forming a film of a conductive material over the entire surface of a piezoelectric plate, subjecting the conductive material to light exposure masking and etching the conductive material.

In the invention, the piezoelectric plate is cut within a target area which extends outwardly from the outermost electrode fingers to a position $\lambda/8$, and preferably $3\lambda/32$, outwardly thereof. The opposite end faces of the piezoelectric plate are cut out by this method to cause an SH-type surface wave to be reflected by the outer electrodes. By cutting in this range, chipping of the outermost finger electrodes is avoided, thus providing favorable resonant characteristics.

The cutting of a piezoelectric plate may be carried out using any suitable cutting apparatus.

BRIEF DESCRIPTION OF THE DRAWINGS

For the purpose of illustrating the invention, there is shown in the drawing a form which is presently preferred, it being understood, however, that the invention is not limited to the precise arrangement and instrumentality shown.

FIG. 12 is a graph illustrating the relation between the position at which the end faces are cut and the resonant characteristics of the resulting surface wave resonators.

DETAILED DESCRIPTION OF THE PREFERRED EMBODIMENT

A method for manufacturing a surface wave device of an end-face reflection type according to one embodiment of the present invention will now be explained with reference to FIG. 5 and FIG. 6.

Figure 1:
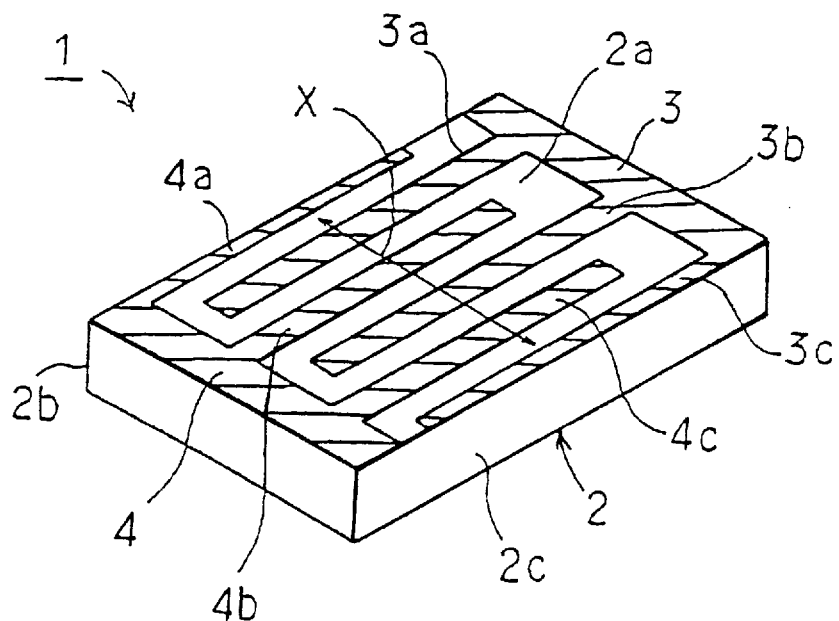
FIG. 1 is a perspective view of a conventional surface wave resonator of an end-face reflection type.
Figure 2:
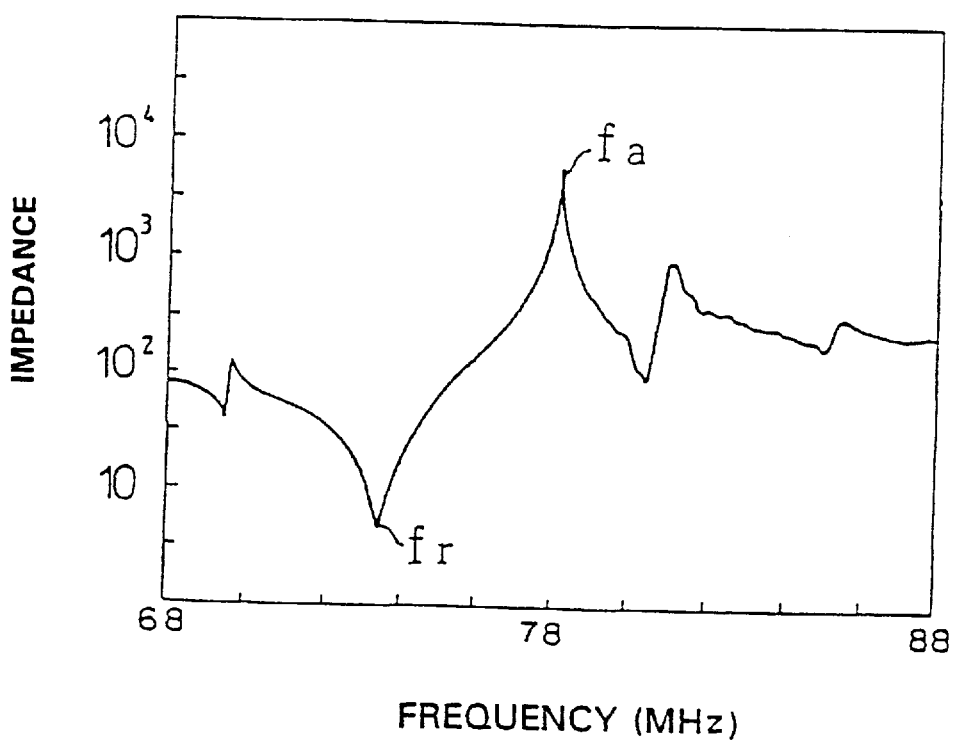
FIG. 2 is a diagram showing the resonant characteristic of the surface wave resonator shown in FIG. 1.
Figure 3:
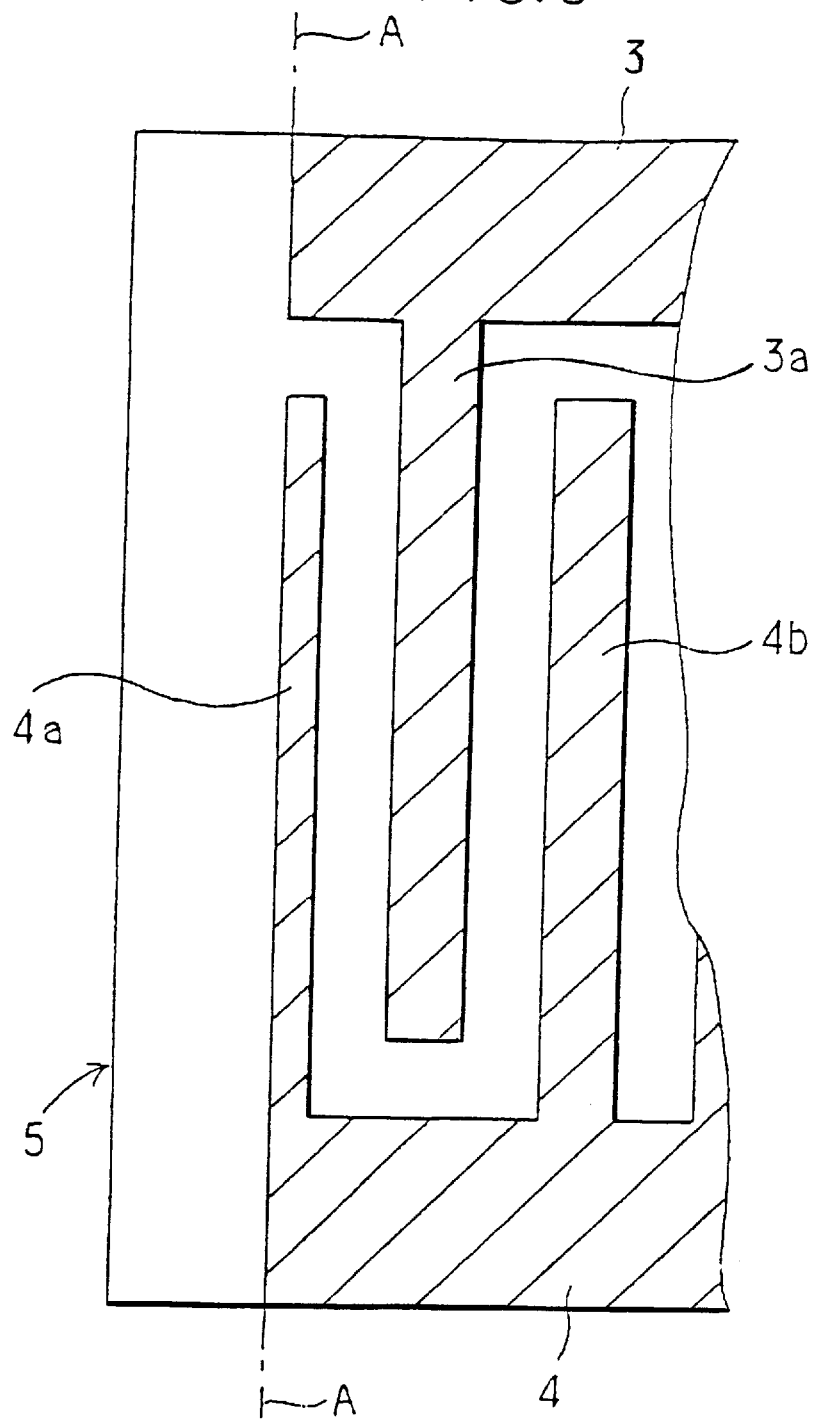
FIG. 3 is a schematic plan view for explaining the conventional process for manufacturing surface wave resonator of the end-face reflection type.
Figure 4:
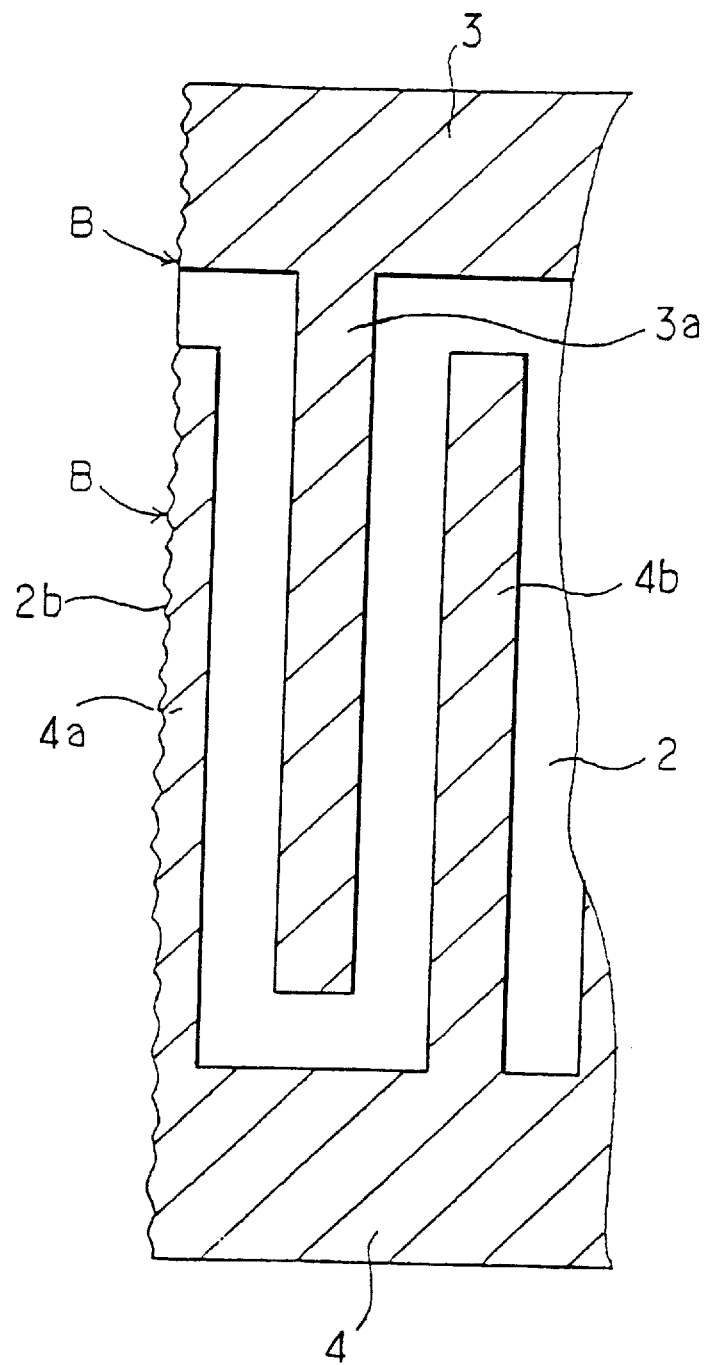
FIG. 4 is a partial plan view of a surface wave resonator showing the occurrence of chipping when the surface wave resonator is manufactured by the conventional process.
Figure 5:
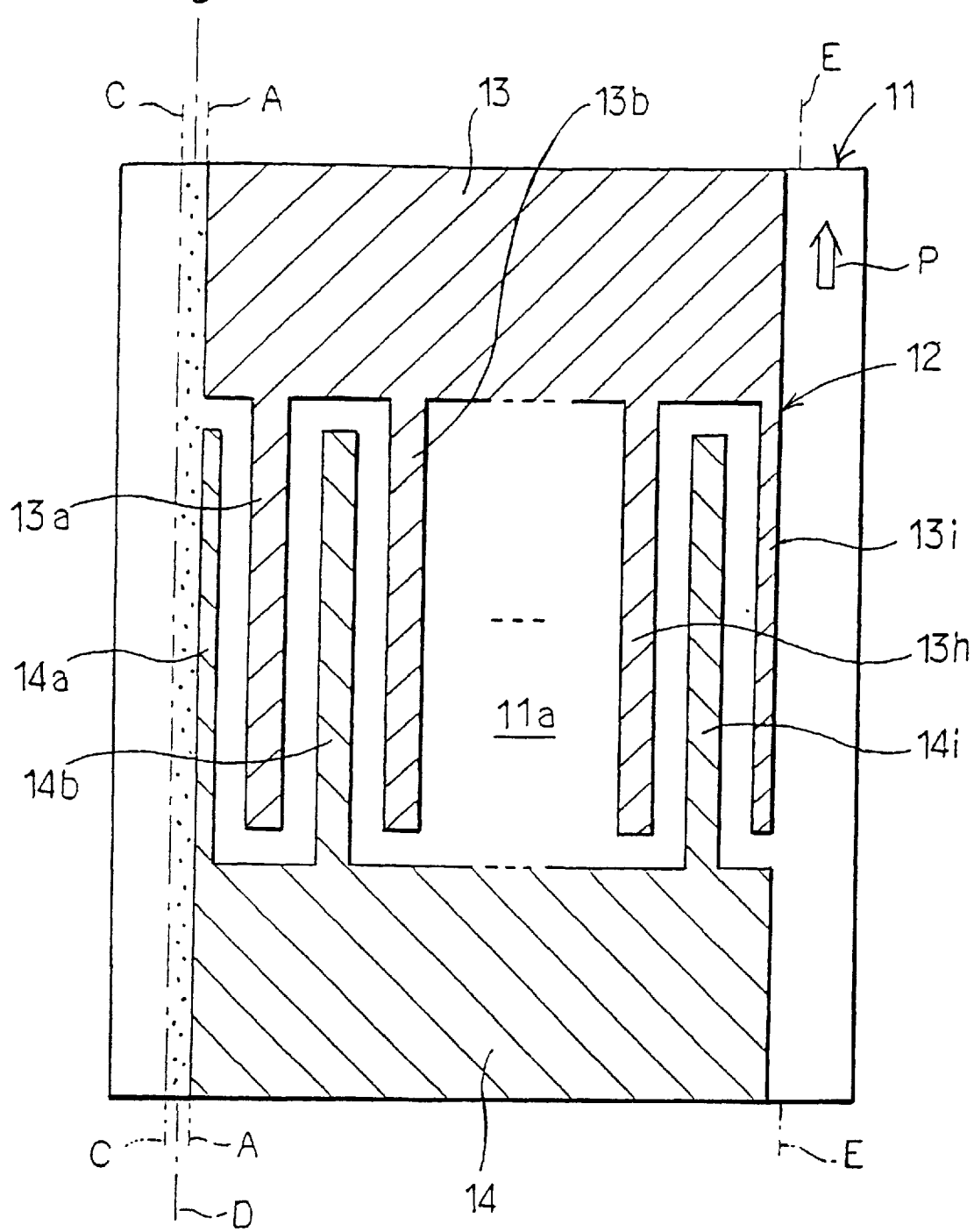
FIG. 5 is a plan view of a surface wave resonator for explaining a state of IDT formed on a piezoelectric plate in accordance with one embodiment of the present invention.
Figure 6:
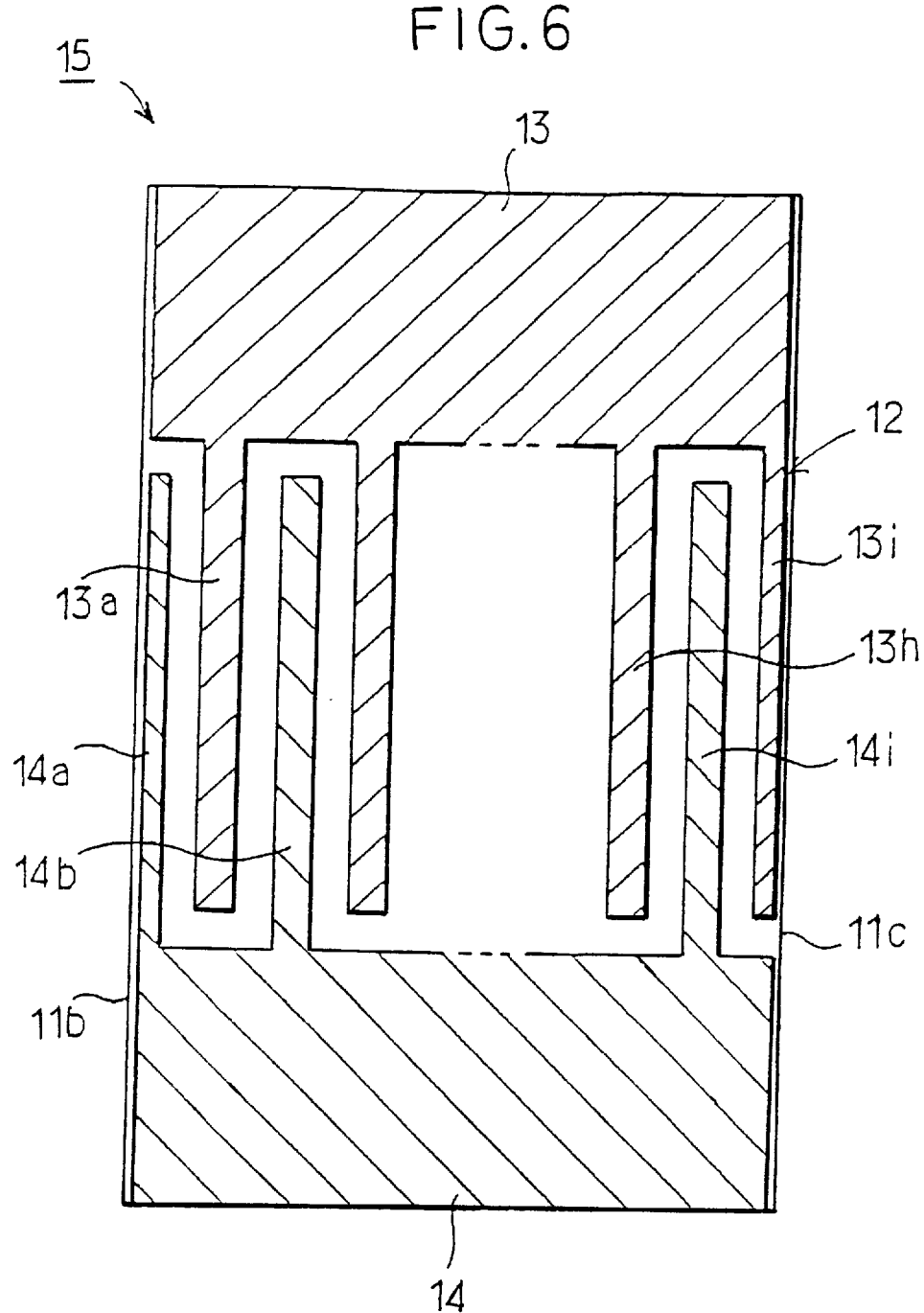
FIG. 6 is a plan view of a surface wave resonator of an end-face reflection type manufactured according to one embodiment of the present invention.

First, an IDT is formed on a piezoelectric plate 11, as shown in FIG. 5. In the present embodiment, the piezoelectric plate 11 is preferably formed of LiNbO$_3$ of 41-degree rotation Y-plate X propagation which is rectangular in plan shape.

The IDT 12 is preferably fabricated by forming an aluminum film over the entire top surface 11a of the piezoelectric plate 11 using a thin-film formation technique such as depositing, sputtering, or plating of aluminum, and further subjecting it to light exposure masking and etching. The IDT 12 has a set of comb-shaped electrodes 13, 14 which include interlaced electrode fingers 13a–13i and 14a–14i.

The outermost electrode fingers 14a, 13i are positioned at opposite ends of the substrate with respect to the direction of propagation of the surface wave generated by the surface acoustic wave device and have a width of $\lambda/8$, wherein $\lambda$ is the wavelength of a surface wave to be oscillated. The remaining electrode fingers 13a–13h, 14b–14i have a width of $\lambda/4$. The distance between adjacent electrode fingers is also $\lambda/4$.

After the comb shaped electrodes 13, 14 have been formed on the surface of the piezoelectric plate 11, the piezoelectric plate 11 is cut along the chain lines D—D and E—E to provide a surface wave device 15 of the end-face reflection type utilizing a leaky surface wave of an SH type. The cutting is performed outside of the outer edge of the electrode fingers 14a, 13i within a range of $\lambda/8$, and preferably $3\lambda/32$, from the outer edge of those electrode fingers.

The left end of the piezoelectric plate 11 is cut by cutting within a region extending from an outer (left) end edge of the electrode finger 14a to a position within $\lambda/8$ to the left thereof. That is, the cutting along chain line D—D is performed within a region illustrated by hatching with multiple dots between the line A—A, i.e., the line along the outer (left) end edge of the electrode finger 14a, and the chain line C—C, i.e., the line spaced from the outer end edge of the electrode finger by $\lambda/8$ and parallel with the line A—A. Similarly, the cutting along the chain line E—E is performed within a region of from an outer (right) end edge of the electrode finger 13i to a position $\lambda/8$ to the right thereof.

Consequently, only the piezoelectric plate 11 is cut, reducing the likelihood that chipping will occur. By utilizing the region shown by the multiple-dotted hatching as a target (hereinafter "the target cutting area") for the cutting operation, there is less possibility of cutting the electrode finger, thereby reducing the possibility that chipping will occur compared to the case where cutting is targeted at the outer end edge of the electrode finger.

In addition, a desired resonant characteristic can be achieved using electrode fingers 14a, 13i having a width of λ/8, i.e., the width of these electrode fingers is not thinner than λ/8.

Although only one IDT comprising one set of comb-shaped electrodes is shown in the surface wave device 15 of the end-face reflection type obtained by the present embodiment, the manufacturing method of the invention is applicable to a surface wave device of the end-reflection type formed with two or more IDTs, such as a surface wave filter of the end-face reflection type for instance.

Also, although an SH-type leaky wave is preferably utilized in the surface wave resonator 16 of the end-face reflection type obtained by the described embodiment, other SH-type surface waves such as a BGS wave or a lobe wave may be used. The material for the piezoelectric plate is selected in accordance with a surface wave to be utilized.

As shown by the experiments described below, the manufacturing method of the present invention provides a surface wave device of the end-face reflection type possessing a favorable resonant characteristics.

A first surface wave device manufactured according to the above-described process includes an LiNbO$_3$ piezoelectric plate 11 of 41-degree rotated Y-plate, X-propagation. The IDT 12 was formed of an aluminum film whose thickness was 1 μm. The width of electrode fingers 13a–13h, 14b–14i was 30 μm. The width of the first and second electrode fingers 14a, 13i was 15 μm. The IDT 12 included 15 pairs of electrode fingers. The width of the target cutting area was 1 μm for each.

Figure 7:
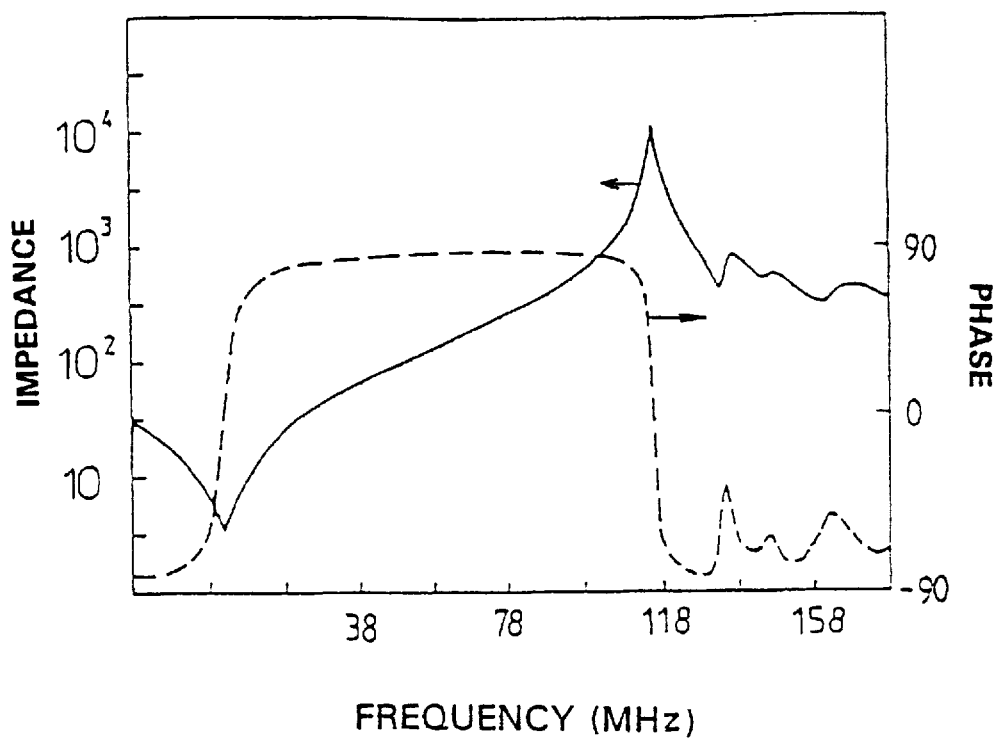
FIG. 7 is a graph illustrating the resonant characteristic of a surface wave resonator of an end-face reflection type of one empirical example manufactured in accordance with one embodiment of the present invention, wherein the solid line shows a characteristic of impedance vs. frequency and the broken line shows a characteristic of phase vs. frequency.

It was ascertained that a favorable resonant characteristic having less spuriousness responses was provided when the end faces 11b, 11c were cut at an area within a range of λ/8 from the outer end edge of the first/second electrode fingers, as shown in FIG. 7 which is a graph showing the resonant characteristic of a surface wave device of an end-face reflection type obtained by the above-described embodiment. The solid line shows the impedance vs. frequency characteristics of the surface wave device and the broken line shows the phase vs. frequency characteristics of the surface wave device.

Various surface wave devices of the end-face reflection type were made in accordance with the present invention but the positions of the cut end faces 11b, 11c were varied and their resonant characteristics were measured. These tests indicated that the resonant characteristics varied in different ways for different cutting positions of the end faces. It was, however, determined the resonant characteristics may generally be categorized into four types of shown in FIG. 8 to FIG. 11.

Figure 8:
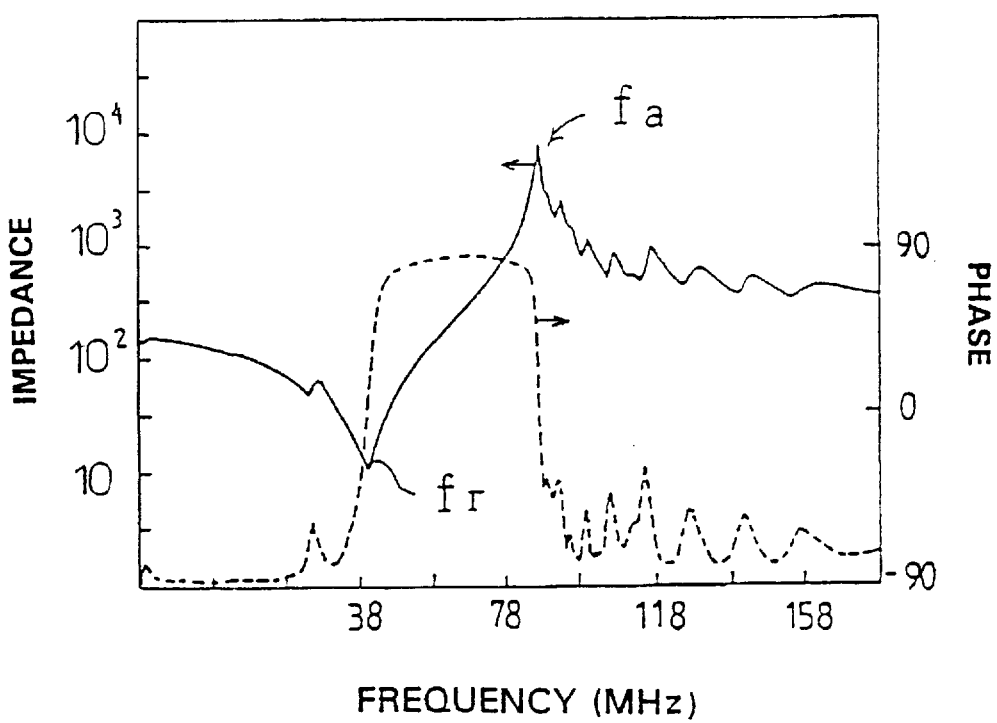
FIG. 8 is a diagram showing a resonant characteristic of a surface wave resonator of an end-face reflection type of another empirical example manufactured in accordance with one embodiment of the present invention.

The resonant characteristic shown in FIG. 8 has an anti-resonant point fa which presents a high frequency site and high anti-resonant impedance, and a resonant point which exhibits a small resonant impedance. Therefore, a sufficiently large band width with a large impedance ratio is provided. The impedance ratio is expressed as:

$$\text{Impedance ratio} = 20 \log \left\{ \frac{\text{anti-resonant impedance}}{\text{resonant impedance}} \right\}$$

Figure 9:
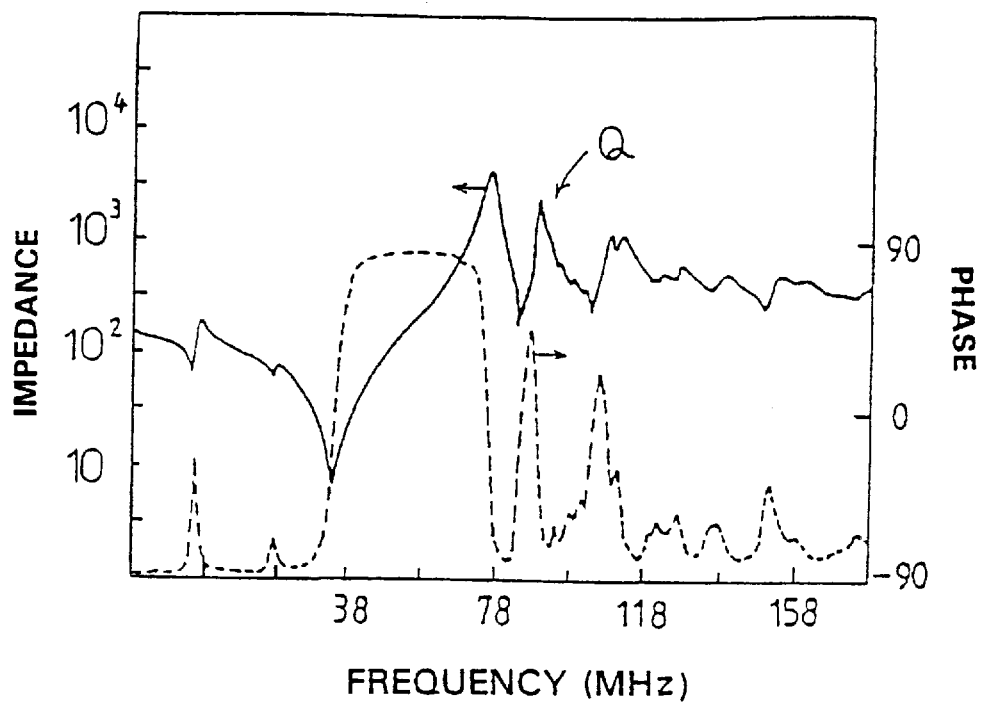
FIG. 9 is a graph illustrating the resonant characteristic of a surface wave resonator of an end-face reflection type where the position of cutting is outside the range of the present invention.

In the resonant characteristic shown in FIG. 9, the resonant point shifts toward the low range side and the impedance for the anti-resonant point is low so that the value of the bandwidth, is reduced. In addition, it will be recognized that spurious characteristics shown by the arrow Q appear in a frequency range higher than the resonant point. Particularly, it is understood that spurious characteristics surpassing zero degree appears in the phase characteristic.

Figure 10:
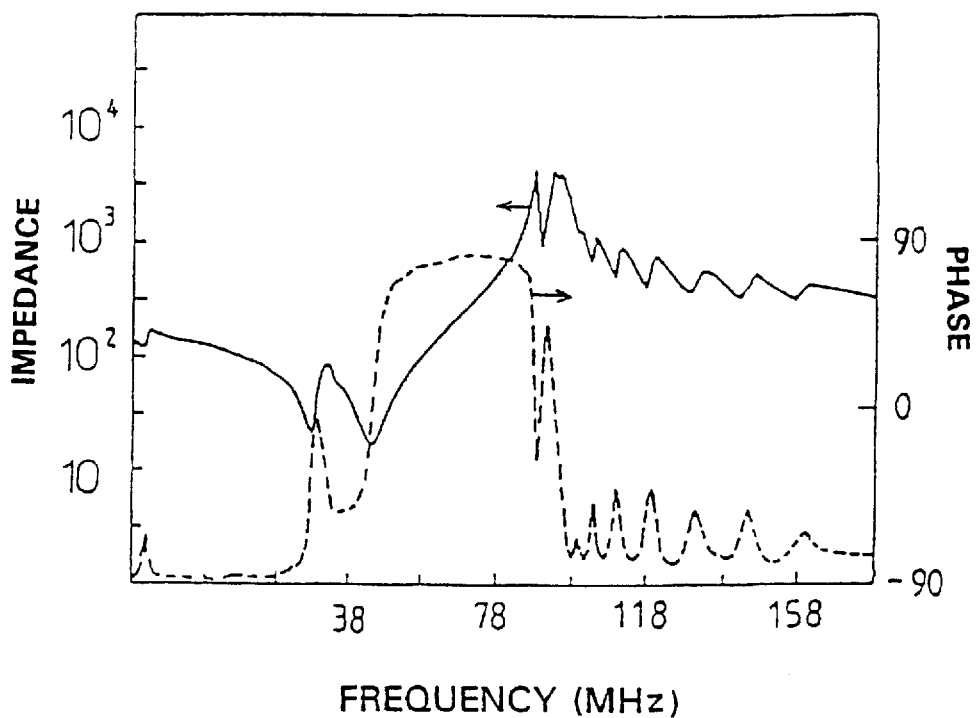
FIG. 10 is a graph illustrating the resonant characteristic of a surface wave resonator of an end-face reflection type where the position of cutting is outside the range of the present invention.

The resonant characteristic shown in FIG. 10 provides a resonant point and an anti-resonant point which are split with a small impedance ratio and the resonant frequency is accordingly reduced. In addition, it is recognized that the difference between the anti-resonant frequency and the resonant frequency is small resulting in a narrow bandwidth. Further, there are significant spurious responses in the vicinity of the resonant point as well as between the resonant point and the anti-resonant point.

Figure 11:
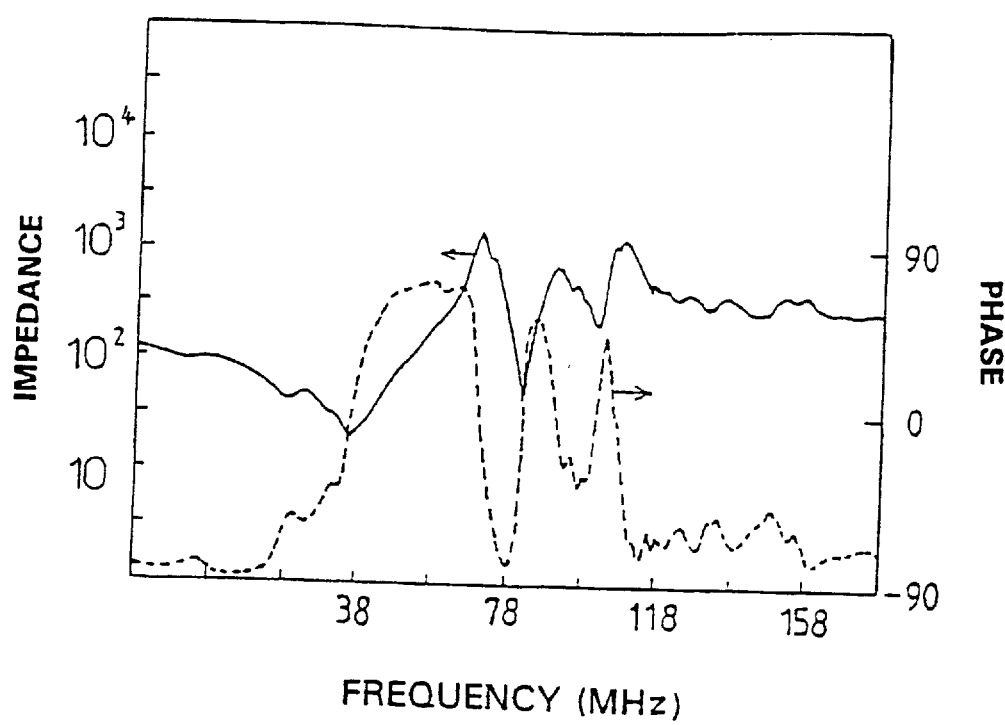
FIG. 11 is a graph illustrating the resonant characteristic of a surface wave resonator of an end-face reflection type where the position of cutting is outside the range of the present invention.

The resonant characteristic shown in FIG. 11, exhibits large spurious oscillations in the vicinity of an anti-resonant point over a wide frequency range with a further reduced impedance ratio and there is no clear resonant characteristic is exhibited.

It will be understood from the foregoing that the resonant characteristics are best in FIG. 8 and gets progressively worse through FIG. 11.

FIG. 12 is a graph showing the relationship between the resonant characteristic obtained and the position at which the end faces are cut. In this graph, the resonant frequency of FIG. 8 is indicated by the mark o, the resonant frequency of FIG. 9 is indicated by the mark Δ, the resonant frequency of FIG. 10 is indicated by the mark □, and the resonant frequency of FIG. 11 is indicated by the mark ×.

The horizontal axis denotes the position along the chain line D—D in FIG. 5 where the piezoelectric plate 11 is cut, while the vertical axis indicates the position along the chain line E—E where the piezoelectric plate 11 is cut. That is, the each cut position is determined by measuring the distance from the outer edge of the first or second electrode finger to the cut point. The designation 0 in FIG. 12 indicates the exact position of the outer edge of the electrode fingers.

As is clear from FIG. 12, good resonant characteristics marked with o are provided where the cut position lies in the range of λ/8 from the first electrode finger 14a toward the outer side and where the second end-face cut position is within the range of λ/8 from the second electrode finger 13 toward the outer side. It is also understood that, in regions outside of this range, the resonant characteristic deteriorates and there are present a number of marks of □, ×, and Δ.

It can therefore be understood from FIG. 12 that a favorable resonant characteristic is provided by cutting the end-faces within a range of λ/8 from the outer edge of the first or second electrode finger. More preferably, the end face should be cut within a distance of 3λ/32 from the outer edge of the electrode finger.

According to the present invention, opposite end faces are formed by cutting a piezoelectric plate in a range of up to λ/8 from outer end edges of first and second electrode fingers on the opposite ends of an IDT after the IDT is formed on the piezoelectric plate, during manufacture of a surface wave device of an end-face reflection type. It is therefore possible to provide a surface wave device of an end-face reflection type possessing a favorable resonant characteristic.

In addition, since the piezoelectric plate is cut in a region outside of the outer edge of the electrode fingers, the likelihood that chipping of the piezoelectric plate will occur is reduced. That is, in the conventional manufacturing method for a surface wave device of an end-face reflection type, cutting for forming end faces has been carried out by targeting an outer edge of electrode fingers on opposite ends of the piezoelectric plate and chipping is apt to occur in the piezoelectric plate. In contrast, such chipping rarely occurs when using the process of the present invention.

The present invention therefore can afford to stably provide a surface wave device of an end-face reflection type having a favorable resonant characteristic with reduced variation in characteristic.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method for manufacturing a surface wave device of an end-face reflection type having interdigital transducers formed on a piezoelectric substrate, said method comprising the steps of:

forming an interdigital transducer on a piezoelectric plate, said interdigital transducer generating a surface wave which propagates along a propagation direction upon the application of an energizing signal thereto, said interdigital transducer having a plurality of interdigited electrode fingers extending generally perpendicular to said propagation direction and including an outermost pair of electrode fingers relative to said propagation direction, said outermost pair of electrode fingers having a width of $\lambda/8$, $\lambda$ being the wavelength of said surface wave, and the remaining said electrode fingers having a width of $\lambda/4$, said interdigital transducer having a width which is less than the width of said piezoelectric plate; and defining a pair of target areas in which to cut said piezoelectric plate, each of said target areas extending from an outer edge of a respective one of said outermost pair of electrode fingers to a position $\lambda/8$ outwardly therefrom; and cutting said piezoelectric plate within said target areas.

2. A method of manufacturing a surface wave device according to claim 1, wherein said target areas are generally rectangular in shape and extend in a direction which is generally perpendicular to said propagation direction.

3. A method of manufacturing a surface wave device according to claim 1, wherein said target area extends outwardly to a position $3\lambda/32$ from said outer end edges of said outermost pair of electrode fingers.

4. A method of manufacturing a surface wave device according to claim 3, wherein said target areas are generally rectangular in shape and extend in a direction which is generally perpendicular to said propagation direction.

5. A method of manufacturing a surface wave device according to claim 3, wherein said piezoelectric plate is formed of a piezoelectric single crystal.

6. A method of manufacturing a surface wave device according to claim 5, wherein said piezoelectric plate comprises a $LiNbO_3$ piezoelectric plate of 41-degree rotated Y-plate X-propagation.

7. A method of manufacturing a surface wave device according to claim 5, wherein said piezoelectric plate comprises an $LiNbO_3$ piezoelectric plate of 64-degree rotated Y-plate X-propagation.

8. A method of manufacturing a surface wave device according to claim 5, wherein said piezoelectric plate comprises a $LiTaO_3$ piezoelectric plate of 36-degree rotated Y-plate X-propagation.

9. A method of manufacturing a surface wave device according to claim 1, wherein said piezoelectric plate is formed of a piezoelectric single crystal.

10. A method of manufacturing a surface wave device according to claim 9, wherein said piezoelectric plate comprises a $LiNbO_3$ piezoelectric plate of 41-degree rotated Y-plate X-propagation.

11. A method of manufacturing a surface wave device according to claim 9, wherein said piezoelectric plate comprises an $LiNbO_3$ piezoelectric plate of 64-degree rotated Y-plate X-propagation.

12. A method of manufacturing a surface wave device according to claim 9, wherein said piezoelectric plate comprises a $LiTaO_3$ piezoelectric plate of 36-degree rotated Y-plate X-propagation.

13. A method for manufacturing a surface wave device of an end-face reflection type having interdigital transducers formed on a piezoelectric substrate, said method comprising the steps of:

forming an interdigital transducer on a piezoelectric plate, said interdigital transducer generating a surface wave which propagates along a propagation direction upon the application of an energizing signal thereto, said interdigital transducer having a plurality of interdigited electrode fingers extending generally perpendicular to said propagation direction and including an outermost pair of electrode fingers relative to said propagation direction, said outermost pair of electrode fingers having a width of $\lambda/8$, $\lambda$ being the wavelength of said surface wave, and the remaining said electrode fingers having a width of $\lambda/4$, said interdigital transducer having a width which is less than the width of said piezoelectric plate; and defining a target area in which to cut said piezoelectric plate, said target areas extending from an outer edge of one of said outermost pair of electrode fingers to a position $\lambda/8$ outwardly therefrom; and cutting said piezoelectric plate within said target area.

14. A method of manufacturing a surface wave device according to claim 13, wherein said target area is generally rectangular in shape and extends in a direction which is generally perpendicular to said propagation direction.

15. A method of manufacturing a surface wave device according to claim 13, wherein said target area extends outwardly to a position $3\lambda/32$ from said outer end edge of said one of said outermost pair of electrode fingers.

16. A method of manufacturing a surface wave device according to claim 15, wherein said target area is generally rectangular in shape and extend in a direction which is generally perpendicular to said propagation direction.

17. A method of manufacturing a surface wave device according to claim 15, wherein said piezoelectric plate is formed of a piezoelectric single crystal.

18. A method of manufacturing a surface wave device according to claim 17, wherein said piezoelectric plate comprises a $LiNbO_3$ piezoelectric plate of 41-degree rotated Y-plate X-propagation.

19. A method of manufacturing a surface wave device according to claim 17, wherein said piezoelectric plate comprises an $LiNbO_3$ piezoelectric plate of 64-degree rotated Y-plate X-propagation.

20. A method of manufacturing a surface wave device according to claim 17, wherein said piezoelectric plate comprises a $LiTaO_3$ piezoelectric plate of 36-degree rotated Y-plate X-propagation.

21. A method of manufacturing a surface wave device according to claim 13, wherein said piezoelectric plate is formed of a piezoelectric single crystal.

22. A method of manufacturing a surface wave device according to claim 21, wherein said piezoelectric plate comprises a $LiNbO_3$ piezoelectric plate of 41-degree rotated Y-plate X-propagation.

23. A method of manufacturing a surface wave device according to claim 21, wherein said piezoelectric plate comprises an LiNbO$_3$ piezoelectric plate of 64-degree rotated Y-plate X-propagation.

24. A method of manufacturing a surface wave device according to claim 21, wherein said piezoelectric plate comprises a LiTaO$_3$ piezoelectric plate of 36-degree rotated Y-plate X-propagation.

* * * * *